United States Patent
Tasumi

[11] Patent Number: 5,818,322
[45] Date of Patent: Oct. 6, 1998

[54] SILICON PHOTOSENSITIVE ELEMENT

[75] Inventor: Toru Tasumi, Tokyo, Japan

[73] Assignee: NEC Corporation, Tokyo, Japan

[21] Appl. No.: 537,351

[22] Filed: Oct. 2, 1995

[30] Foreign Application Priority Data

Oct. 3, 1994 [JP] Japan ................................ 6-238799

[51] Int. Cl.$^6$ .................................................. H01L 31/08
[52] U.S. Cl. ................................ 338/15; 357/30; 357/42
[58] Field of Search .......................... 338/13–15; 257/10, 257/11, 21, 53–56; 437/2–4, 35; 357/4, 30, 42

[56] References Cited

U.S. PATENT DOCUMENTS

| | | | |
|---|---|---|---|
| 3,978,509 | 8/1976 | Gouin et al. | 357/30 |
| 4,462,019 | 7/1984 | Ewaldt et al. | 338/15 |
| 4,725,870 | 2/1988 | Bean et al. | 357/4 |
| 4,847,210 | 7/1989 | Hwang et al. | 437/3 |
| 5,155,571 | 10/1992 | Wang et al. | 357/42 |
| 5,576,221 | 11/1996 | Takemura et al. | 437/2 |

FOREIGN PATENT DOCUMENTS

| | | |
|---|---|---|
| 0 469 790 | 2/1992 | European Pat. Off. . |
| 0 663 699 | 7/1995 | European Pat. Off. . |
| 6085235 | 3/1994 | Japan . |

OTHER PUBLICATIONS

"Avalanche Gain in $Ge_xSi_{1-x}$/Si Infrared Waveguide Detectors," by T. P. Pearsall et al., IEEE Electron Device Letters, vol. EDL–7, No. 5, May 1986, pp. 330–332.

"$Ge_{0.6}Si_{0.4}$ Rib Waveguide Avalanche Photodetectors for 1.3 $\mu$m Operation," by H. Temkin et al., Appl. Phys. Lett. 49 (13), Sep. 29, 1986, pp. 809–811.

"Integration of Waveguides and Photodetectors in SiGe for 1.3 $\mu$m Operation," by A. Splett et al., IEEE Photonics Technology Letters, vol. 6, No. 1, Jan. 1994, pp. 59–61.

"Si/SiGe Heterostructures Grown on SOI Substrates by MBE for Integrated Optoelectronics," by V. P. Kesan et al., Journal of Crystal Growth 111, 1991, pp. 936–942.

*Primary Examiner*—Tu B. Hoang
*Attorney, Agent, or Firm*—Foley, Hoag & Eliot LLP

[57] ABSTRACT

A groove is formed on the surface of a silicon substrate by way of etching. A silicon device for a driver of a photosensitive element is formed on the surface of the substrate where the groove is not formed. With the groove, a super lattice structure of Si and $Si_{1-x}Ge_x$ is buried to form a photosensing portion. The photosensing portion is formed with an avalanche photodiode or a PIN diode. The photosensing portion is formed to have no step with the surface of the substrate. On the other hand, SOI silicon oxide layer is provided on the back side of the substrate to form the structure of SOI substrate. BY this, a photo reflection layer of $SiO_2$ layer is provided below the photosensing portion. Thus, a silicon type photosensing element and the silicon device for driver can be formed on a common chip simultaneously for reducing production cost and for improving sensitivity and photo converting efficiency of the photosensing element.

19 Claims, 3 Drawing Sheets

SILICON PHOTOSENSITIVE ELEMENT

BACKGROUND OF THE INVENTION

1. Field of the Invention

This invention relates generally to a silicon photosensitive element. More specifically, the invention relates to a silicon photosensitive element for an optical communication of an OEIC structure, which photosensitive element has a superlattice structure of Si and $Si_{1-x}Ge_x$ mixed crystal at a photosensing portion and a high speed silicon device for driving the photosensing portion at the circumference thereof.

2. Description of the Related Art

An optical communication network in a 1.3 micron band is becoming important as a future multi-media data communication means for family use. As a photosensitive element in the 1.3 micron band, compound type material is currently employed. However, such compound type material holds a problem in the viewpoint of reliability. On the other hand, a drive for the 1.3 micron band is typically a Si device. Therefore, both elements cannot be formed within a common chip, which cause rising production costs and constrains down-sizing.

As a photosensitive element for the 1.3 micron band employing a Si type material, an avalanche photodiode type element employing Si and SiGe has been reported in IEEE, Electron Device Letters, Vol. EDL-7 No. 5, May 1986, P330 to 332 and Appl. Phys. Lett. 49(13), Sep. 29, 1986, P809 to 811. The report proposes a photosensitive element which is fabricated by forming a PN junction and a superlattice structure of $Si/Si_{1-x}Ge_x$ (x=0.6) by employing epitaxial growth technology on a Si substrate having a surface, on which nothing is formed, forming a photosensing portion by way of mesa etching, and introducing light through a cleavage surface by means of an optical fiber. However, in this structure, while the photosensing portion of the avalanche photodiode can be formed, a large step may be formed on the silicon substrate by performing mesa etching. This step can cause a conductor wiring layer to be discontinuously formed on the surface of the silicon substrate, making it difficult to form the driver of the Si device on the common chip. Even when this problem is avoided, it becomes necessary to perform a Si transistor fabrication process after formation of the mesa structure. Since the transistor fabrication process requires high temperature heat treatment, it is possible to break the superlattice structure of $Si_{1-x}Ge_x/Si$.

Furthermore, in such mesa structure, since the PN junction of the avalanche diode is exposed, it becomes necessary to perform passivation. Because the passivation has to be performed at low temperature to avoid breaking the superlattice structure of $Si/Si_{1-x}Ge_x$, it is difficult to satisfactorily perform passivation. Accordingly, in the above-mentioned prior art, a leak current flowing on the mesa etching surface, and thus a dark current in the photosensing portion becomes large to cause difficulty in rising sensitivity.

Furthermore, in the superlattice structure of $Si_{1-x}Ge_x/Si$ serving as a light absorbing layer, large distortion is present since Ge has a greater lattice constant. Therefore, when several thousands Å of thickness is provided for the superlattice structure, defects may be caused, this increasing dark current. Accordingly, the thickness of the light absorbing layer must be quite thin the diameter of the optical fiber core. Therefore, even when light is introduced through the cleavage surface to provide greater thickness in a direction parallel to the wafer surface, efficiency becomes low due to the small cross sectional area of the light absorbing layer.

Therefore, as proposed in A. Splett et al., IEEE Photonic Technology letters, Vol 6, No. 1, January, 1994, p 59 to 61, efficiency can be improved by employing a structure fabricated through the process of forming 2 µm of $Si_{1-x}Ge_x$ containing 2% of Ge on a Si substrate and subsequently forming an avalanche photodiode having a superlattice structure of $Si_{1-x}Ge_x/Si$ thereon, and thus by forming a wave guide of $Si_{1-1}Ge_x$ to enclose the light due to the difference of indexes of refraction between the $Si_{1-x}Ge_x$ layer and the Si between substrate. However, the difference of the the indexes of refraction between the $Si_{1-x}Ge_x$ layer containing 2% between Ge and the Si substrate is too small to provide sufficient light enclosing effect. In order to increase the difference of the refraction indexes to completely enclose the light, the mixing rate of Ge has to be increased. However, increasing of the Ge mixing rate inherently causes the problem of distortion as set forth above.

SUMMARY OF THE INVENTION

Therefore, it is an object of the present invention to provide a silicon photosensitive element, in which a silicon type photosensitive element and a silicon driver can be formed simultaneously on a common substrate and can achieve high sensitivity and light conversion efficiency.

A silicon photosensitive element for optical communication, according to the present invention is constructed by providing a silicon device to serve as a driver on the surface of a silicon substrate. A groove is formed on the surface of the substrate by etching the silicon substrate. Then, an avalanche photodiode or a PIN diode as a photosensing portion having a superlattice structure of Si and $Si_{1-x}Ge_x$ is formed within the groove in such a way that a step between the photosensing portion and the surface of the substrate is not formed.

On the other hand, according to the present invention, a $SiO_2$ layer as a photo reflection layer may be provided below the avalanche photodiode or the PIN diode of the photosensing portion, to form a SOI structure.

Furthermore, according to the present invention, a $SiO_2$ layer as a photo reflection layer may be provided below the avalanche photodiode or the PIN diode of the photosensing portion, to form a SOI structure, and a silicon layer as a photo waveguide may be provided between the avalanche photodiode or the PIN diode and the $SiO_2$ photo reflection layer.

Since the present invention is constructed by arranging a silicon device to serve as a driver on the surface of a silicon substrate and a groove is formed on the surface of the substrate by etching the silicon substrate, and the avalanche photodiode or PIN diode as a photosensing portion having a superlattice structure of Si and $Si_{1-x}Ge_x$ is buried within the groove, a step between the photosensing portion and the surface of the substrate can be avoided to thereby prevent formation of a step and thus eliminate attendant breakage of wiring associated with such a step. Therefore, the photosensing portion and the silicon device for the driver can be formed on a common chip. On the other hand, since the $Si_{1-x}Ge_x$ layer forming the photosensing portion can be grown at the final stage of the process, defects in the photosensing portion will not be caused by high temperature heat treatment during formation of the driver. Therefore, dark current may be reduced. Furthermore, since the PN junction of the diode can be completely covered by the side wall oxide layer during the process of selective epitaxial growth, dark current due to junction leakage can be minimized.

In addition, when the $SiO_2$ layer is provided below the avalanche photodiode or the PIN diode, the light discharged from the optical fiber core portion can be enclosed in the photosensitive portion without causing diffusion in the Si substrate by a difference in the index of refraction between the $SiO_2$ layer and the upper silicon or $Si_{1-x}Ge_x$ layer. Thus, light conversion efficiency can be improved. Furthermore, when a silicon layer having a thickness of several microns is formed below the avalanche photodiode or the PIN diode as the photosensing portion, the silicon layer may serve as a photo waveguide so that the light introduced within this range is sequentially introduced in the $Si/Si_{1-x}Ge_x$ photo absorbing layer. Thus, the problem that the cross-sectional area of the photo absorbing layer is much thinner in comparison with the cross-sectional area of the core portion of the optical can be largely eliminated, and thus, the light conversion efficiency can be improved.

BRIEF DESCRIPTION OF THE DRAWINGS

The present invention will be understood more fully from the detailed description given herebelow and from the accompanying drawings of the preferred embodiment of the invention, which, however, should not be taken to limit to the present invention, but are provided for explanation and understanding only.

In the drawings.

DESCRIPTION OF THE PREFERRED EMBODIMENT

The preferred embodiment of a silicon type photosensitive element according to the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to unnecessary obscure the present invention.

Figure 1A:
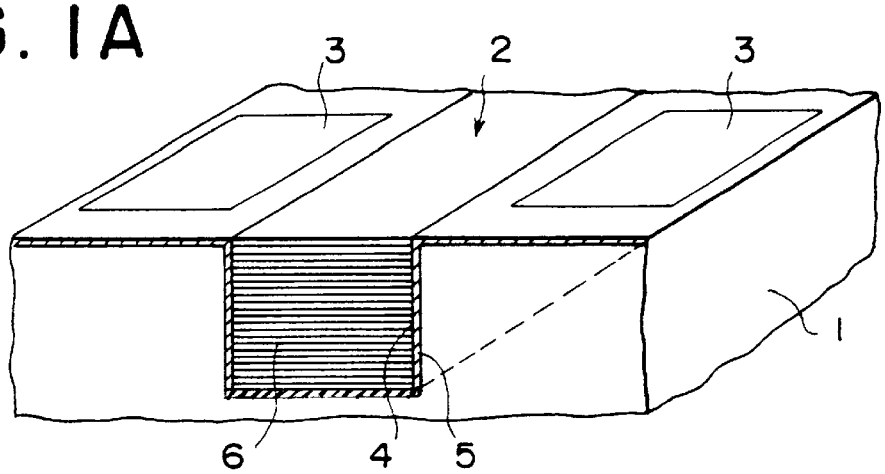
FIGS. 1A to 1C are general views showing a preferred embodiment of a silicon photosensitive element according to the present invention.

As shown in FIG. 1A, a photosensing portion 2 and a silicon device 3 are formed on the surface of a silicon (Si) substrate 1. In the photosensing portion 2, a groove 4 is formed by selectively etching the surface of the silicon substrate 1. The entire surface including the groove 4 and the silicon device 3 is covered with a silicon oxide layer 5 or a silicon nitride layer. After formation of the silicon oxide layer 5, a superlattice structure 6 of Si and $Si_{1-x}Ge_x$ is buriedly formed by selective epitaxial growth within the groove 4 to form the photosensing portion 2. The photosensing portion 2 is constructed as an avalanche photodiode or a PIN diode.

Preferably the photosensing portion 2 is buried by selective epitaxial growth, the silicon substrate is etched in a substantial depth, an optical fiber is fixed to be placed at the same height to the photosensing portion to form a construction to introduce the light in parallel along the surface, and electrodes are formed at respective portion. In this manner, the step on the surface of the substrate can be eliminated, and breakage due to a step in the wiring can be avoided. Therefore, the photosensing portion and the driver can be formed on a common chip. On the other hand, since the $Si_{1-x}Ge_x$ layer as the photosensing portion can be grown at the final step of the device fabrication process, defects which cause dark current will not be formed during high temperature heat treatment in the formation process of the silicon device which forms the driver. Furthermore, since the PN junction is completely covered by the side wall oxide layer during the process of epitaxial growth, dark current due to junction leakage can be minimized.

Figure 1B:
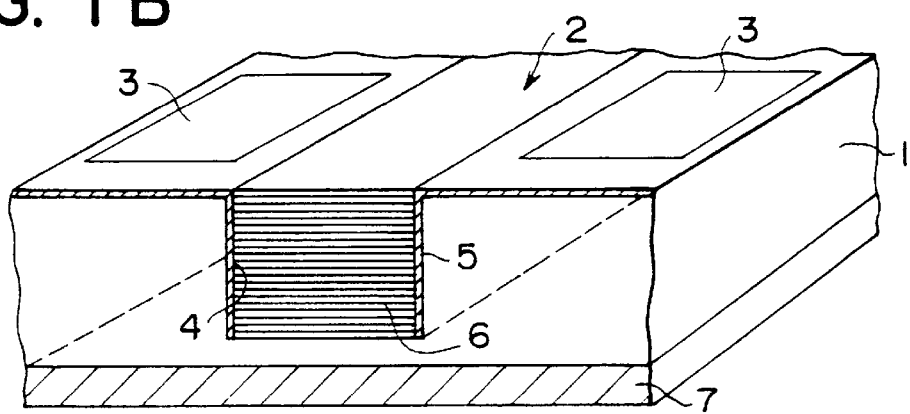

Next, as shown in FIG. 1B, by employing a lamination type or SIMOX type SIO substrate as a substrate 1, a SOI silicon oxide layer 7 is provided on the back side of the silicon substrate 1. Therefor, the silicon oxide layer 7 is provided below the photosensing portion 2 constructed by the avalanche photodiode or PIN diode which is formed at the surface of the silicon substrate 1. This causes light discharged from the optical fiber core portion to be enclosed within the photosensing portion 2 without causing diffusion in the silicon substrate because of a difference in the index of refraction between the $SiO_2$ layer and the $Si_{1-x}Ge_x$ layer. Thus, light conversion efficiency can be improved.

Figure 1C:
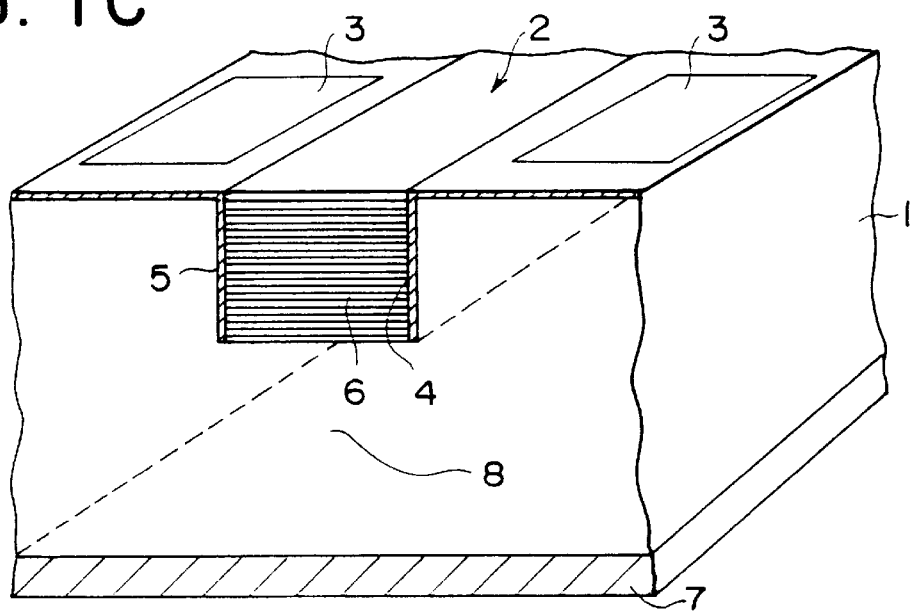

Also, as shown in FIG. 1C, when a several $\mu$m thick silicon layer is formed below the avalanche photodiode or the PIN diode by controlling the thickness of an upper silicon layer of the lamination type or SIMOX type SOI substrate, the silicon layer may serve as an optical wave guide 8. Then, the light introduced into the silicon layer as the optical wave guide is sequentially introduced into the photo absorbing layer of $Si/Si_{1-x}Ge_x$ and converted therein into electric signals. By providing such optical wave guide, the problem that the cross-sectional area of the photo absorbing layer is quite small in comparison with the cross-sectional area of the core portion of the optical fiber can be solved to further improve the light conversion efficiency.

In order to realize the structures shown in FIGS. 1A to 1C, it becomes necessary to selectively grow a superlattice structure thick several thousands Å thick of Si and $Si_{1-x}Ge_x$ to form the avalanche photodiode or the PIN diode without causing facet and defects from the side wall. Thus, when a thick layer is selectively grown, it is inherent to perform simultaneous irradiation of halogen type gas. However, this may cause facets to occur.

The inventors of the present invention have found that occurrence of facets or defects from the side wall can be suppressed by irradiating a silane type gas on the silicon surface at such a growth temperature, at which coverage of the silicon surface by hydrogen becomes sufficiently high, for performing selective epitaxial growth. It is believed that this effect is attained since the hydrogen on the surface restricts diffusion of the atoms on the surface. However, under such conditions, it is not possible to grow a thick selectively grown layer. When $Si_2H_6$ gas is irradiated on $SiO_2$, the molecule of $Si_2H_6$ gas is first trapped on the surface of the $SiO_2$ in metastable state, and then released again. At this time, at a probability determined by the substrate temperature, a small number of $Si_2H_6$ molecules decompose a Si atom to deposit on the $SiO_2$ surface. When the amount of Si atom deposited on the $SiO_2$ reaches a critical amount, it causes nucleation to form a polycrystalline silicon island on the $SiO_2$. Once the polycrystalline silicon island is formed, since the growth speed of Si becomes equal to the growth speed at the Si opening portion, the polycrystalline silicon island grows abruptly. In case of growth employing the silane type, selective growth is broken through the foregoing process.

The inventor has further found that selectivity is not broken even by growing a thick layer and the selectively grown silicon layer is almost not etched by inserting a steps of interrupting the growth of the polycrystalline silicon core on the $SiO_2$ before the core becomes large, maintaining the temperature of the substrate within a given range and irradiating only $Cl_2$ or $F_2$ molecule to the substrate. The effect is based on the following principle. When the $Si_2H_6$ gas is irradiated on the $SiO_2$, Si atom density on the $SiO_2$ is increased progressively. When $Cl_2$ or $F_2$ is irradiated on the $SiO_2$ before formation of polycrystalline silicon is caused, the Si atom on the $SiO_2$ reacts with $Cl_2$ or $F_2$ to cause evaporation as $SiCl_2$ or $SiF_2$ having high vapor pressure. At this time, while halogen gas is also irradiated onto the Si epitaxial layer above the Si opening portion, no etching is caused on Si crystal. It is considered that for etching the Si crystal, it is required to cut a high covalency back bond, and whereas Si on the $SiO_2$ has relatively weak back bond to cause such difference. Accordingly, it becomes possible to continue growth again. However, once the polycrystalline silicon core is formed, Si in the core cannot react with $Cl_2$ or $F_2$. Therefore, once polycrystalline silicon core, has been formed it becomes impossible to make Si evaporated. In case of $Si_3N_4$, the condition of the selective growth can be extended on the basis of the same principle. By repeating the foregoing process, the thick Si and $Si_{1-x}Ge_x$ layer can be grown without causing facets or dislocations. Thus, the structures as shown in FIGS. 1A to 1C can be realized.

Figure 2A:
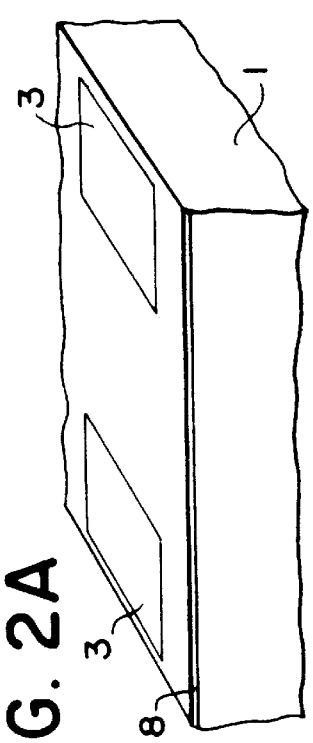
FIGS. 2A to 2D are general views showing a fabrication process of the preferred embodiment of the silicon photosensitive element according to the invention.
Figure 2B:
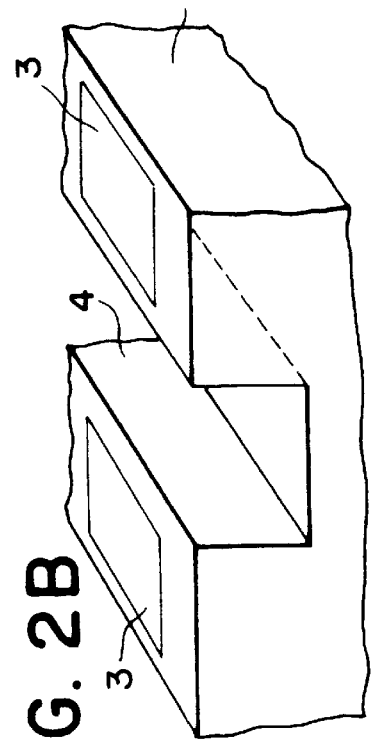

Next, discussion will be given for a concrete example of a fabrication process of the preferred embodiment of the photosensitive element illustrated in FIG. 1A. FIGS. 2A to 2D are diagrammatic illustration showing the shown photosensitive element fabrication process in order of the process steps. At first, as shown in FIG. 2A, on the surface of the Si substrate 1 which has (100) face on the surface, the device 3 for driver, such as pre-amplifier, identification circuit and so forth is formed through normal silicon process. Also, the entire surface of the Si substrate 1 is covered with the oxide layer 8. Next, as shown in FIG. 2B, after masking the portion of the device 3 for the driver with a resist layer, dry etching is performed to form a groove 4 with dimensions of 1 μm in depth, 30 μm in width and 500 μm in length, for example, on the surface of the portion of the substrate 1 where the device 3 is not formed.

Figure 2C:
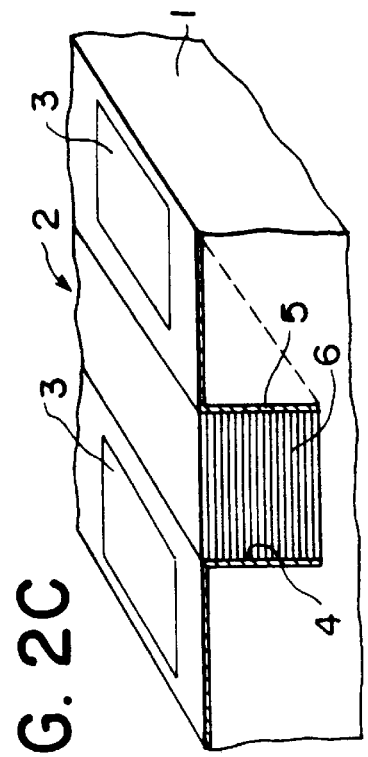

Subsequently, as shown in FIG. 2C, after performing thermal oxidation of the entire surface, the side wall of the oxide layer 5 is formed on the side surface of the groove 4 by etching back. At this time, on the bottom of the groove 4, a silicon region of the substrate 1 is exposed. Also, arsenic is injected to the bottom of the groove 4 by way of ion implantation to form a n-type layer in a doping rate of about $2 \times 10^{19}$ cm$^{-3}$. Next, by chemical washing, contaminant on the bottom of the groove 4 is removed. Thereafter, the superlattice structure 6 of Si and $Si_{1-x}Ge_x$ is formed by selective epitaxial growth in the groove 4. By this, the avalanche photodiode as the photosensitive element can be formed.

In the growth of the superlattice structure 6, UHV-CVD device for silicon was employed. As a primary discharge pump, a turbo molecular pump having a discharge rate of 1000 l/s is employed. $Si_2H_6$ gas, $GeH_4$ gas and $Cl_2$ gas are mass flow controlled, to supply the gas obliquely from 100 mm lower position through a stainless steel nozzles which are independent of each other. At a substrate temperature of 660° C., 1 SCCM of $Si_2H_6$ gas is supplied for 400 seconds. Subsequently, the substrate temperature is risen to 775° C., $Cl_2$ gas is supplied for 30 seconds. By repeating the foregoing processes (supply of $Si_2H_6$ gas at 660° C. and supply of $Cl_2$ gas at 775° C.) respectively three times, 3000 Å of non-doped silicon layer was formed. Subsequently, at the substrate temperature of 660° C., 1 SCCM of $Si_2H_6$ gas is supplied for 400 seconds and 1 SCCM of $B_2H_6$ gas (diluted to have 1% of $H_2$) is supplied for 400 seconds. Thereafter, rising the substrate temperature to 775° C., $Cl_2$ gas is supplied for 30 seconds. By repeating this process twice, B-doped silicon layer in a thickness of 2000 Å and in a doping rate of $2 \times 10^{17}$ cm$^{-3}$ is formed. Furthermore, at the substrate temperature of 480° C., 1 SCCM of $Si_2H_6$ gas and 20 SCCM of $GeH_4$ gas are supplied for 50 seconds, and at the substrate temperature of 610° C., 1 SCCM of $Si_2H_6$ gas for 30 seconds. By repeating this for 10 times, 10 cycle of superlattice structure constituted of 50 Å of $Si_{0.4}Ge_{0.6}$ layer and the silicon layer of 100 Å. At this time, by rising the temperature to 775° C. once per two cycles and supplying $Cl_2$ for 30 seconds, selectivity is assured. Subsequently, at the substrate temperature of 660° C., 1 SCCM of $Si_2H_6$ gas and 10 SCCM of $B_2H_6$ gas (diluted to contain 1% of $H_2$) are supplied for 400 seconds. Thereafter, by rising temperature to 775° C., $Cl_2$ is supplied for 30 seconds. By repeating these processes twice, a silicon layer of 2000 Å in the thickness and $2 \times 10^{19}$ cm$^{-3}$, doped with B is formed.

Figure 2D:
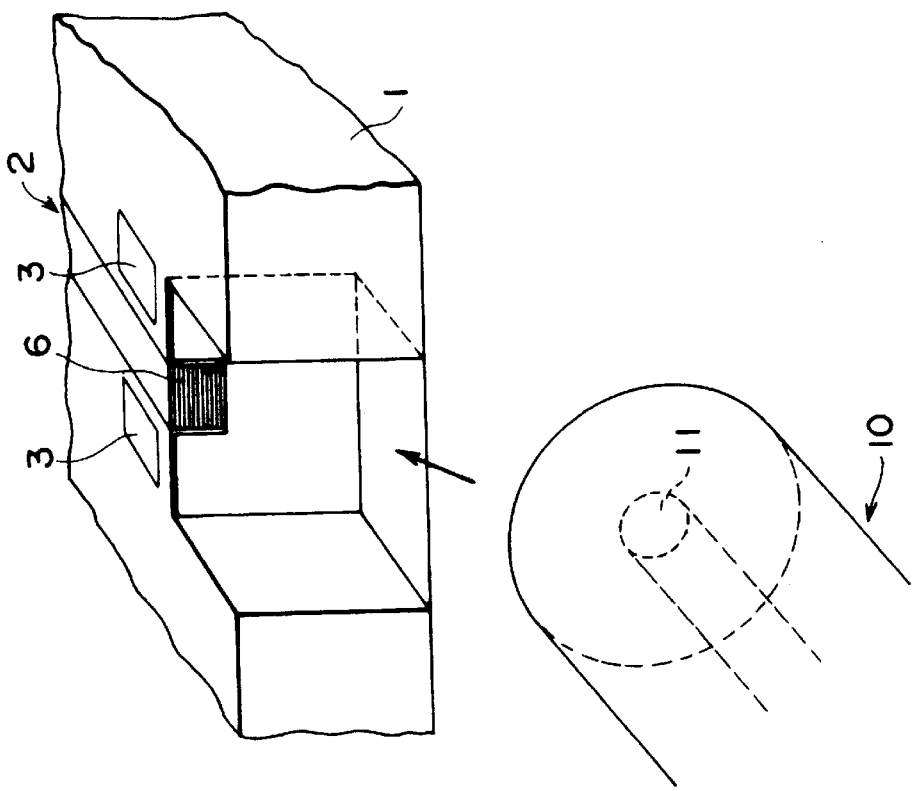

Subsequently, as shown in FIG. 2D, the silicon substrate 1 at the portion where the optical fiber 10 should be fixed is etched in a depth of 63 μm and in a width of 125 μm, for example. Then, the optical fiber 10 is fixed so that the core portion 11 may be placed at the same height to the photosensing portion 2. By this, the light from the optical fiber 10 can be introduced into the photosensing portion 2 in parallel along the surface of the substrate 1.

When electrodes at respective portion are formed, since no step is present on the surface, the wiring will never cut by the step. Accordingly, the photosensing portion 2 and the Si device 3 (the driver) can be connected with the wiring which has no step and is not possible to be broken. Therefore, the photosensing portion 2 and the driver device 3 can be formed on a common chip. Also, since the $Si_{1-x}Ge_x$ layer of the photosensing portion 2 can be grown at the final step in the device fabrication process, no defect will be created in the superlattice structure by high temperature heat treatment in the process step of forming the silicon device 3. Therefore, dark current will never be caused. Furthermore, since the PN junction is completely covered with the side wall oxide layer 5 during the process of selective epitaxial growth, generation of dark current due to leakage at the junction can be minimized. At this time, the capacity of the avalanche photodiode was 0.3 pF/$\mu^2$ upon application of 10V.

Figure 3:
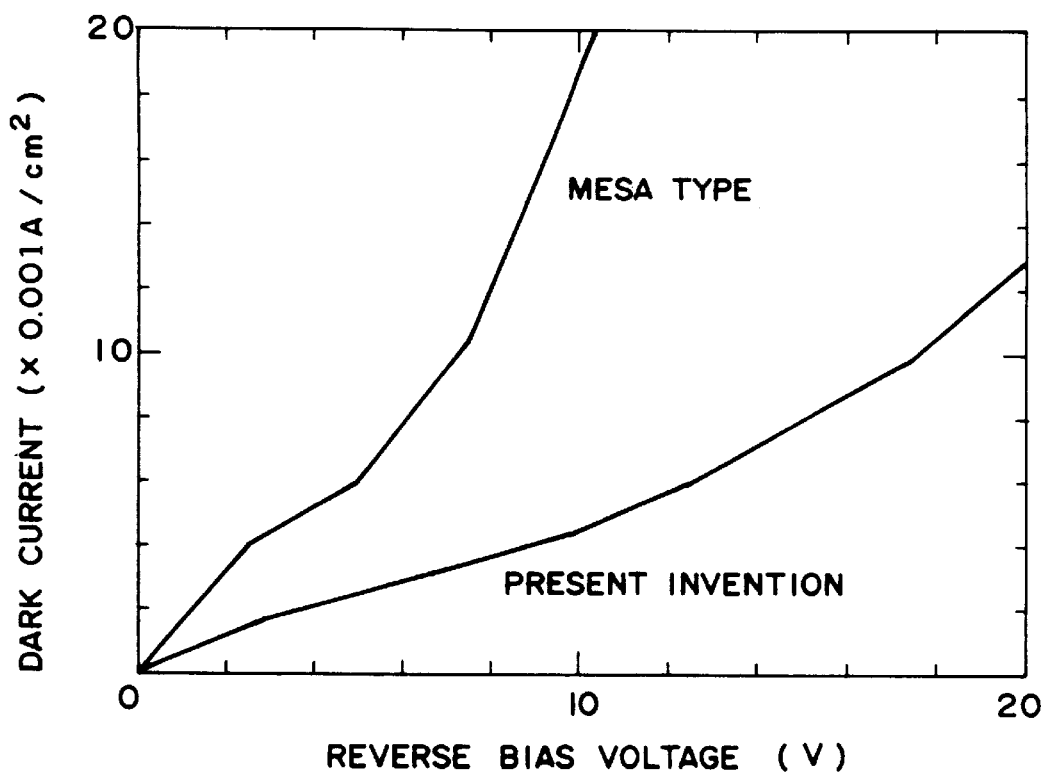
FIG. 3 is a chart showing a relationship between a reverse bias voltage and a dark current in the preferred embodiment of the silicon type photosensitive element according to the invention and the conventional mesa type element.

FIG. 3 shows a relationship between a reverse bias voltage of the avalanche photodiode and the dark current. In addition, a reverse bias-dark current curve of the mesa type photosensitive element reported in Appl. Phys. Lett. Vol. 49, p809 is shown in FIG. 3 for comparison. As can be clear from FIG. 3, the dark current of the avalanche photodiode buried by way of selective growth is small. Therefore, sensitivity of this avalanche photodiode is high. When 140 ps pf pulse of 1.3μ wavelength of Nd:YAG laser is fed, sensitivity in reception of the photosensitive element of the present invention was −36 dBm. While the foregoing embodiment has been discussed in terms of employment of the avalanche photodiode in the photosensing portion, it has been confirmed that similar effects may be attained even when the PIN diode is employed.

Next, concrete discussion will be given for characteristics of the photosensitive element shown in FIG. 1B. The construction of FIG. 1B can be obtained by employing SIMOX or laminated type SOI substrate as the Si substrate. In the present invention, the lamination type SOI substrate constituted of a $SiO_2$ layer in thickness of 0.5 $\mu$m and an upper silicon layer in thickness of 1.5 $\mu$m. On the substrate, the silicon device 3 for driver and the avalanche photodiode forming the photosensing portion 2 are formed through the process as shown in FIGS. 2A to 2D.

Figure 4:
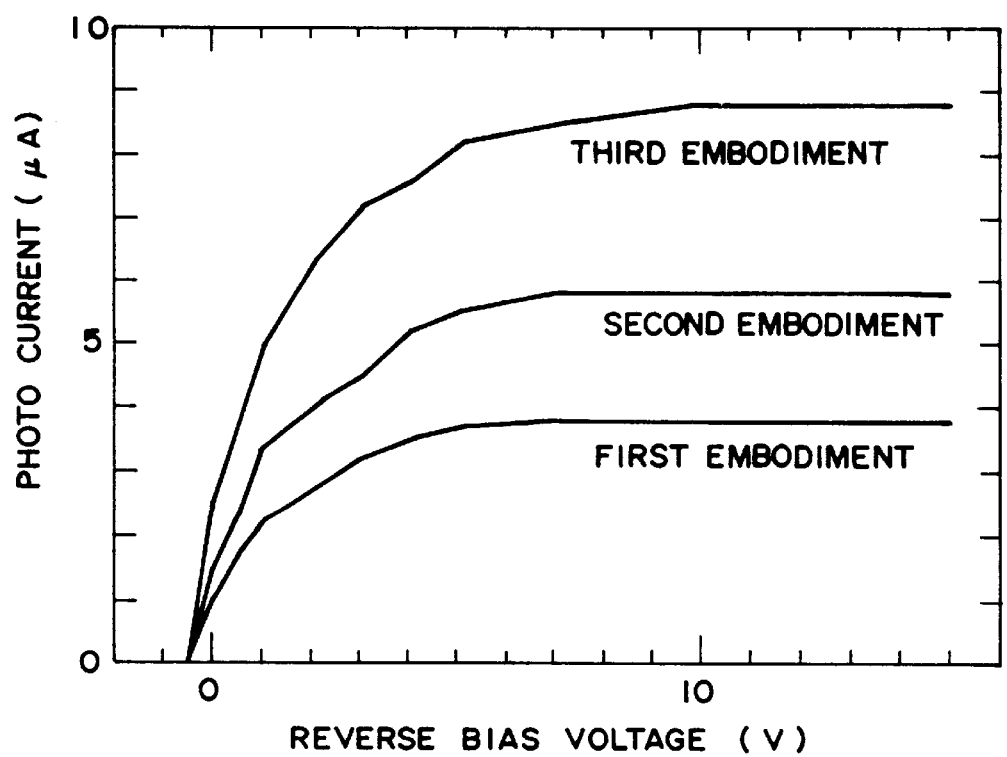
FIG. 4 is a chart showing a relationship between a reverse bias voltage and a photo current of the preferred embodiment of the silicon type photosensitive element according to the invention.

FIG. 4 shows a relationship between the reverse bias voltage and a photo current upon introduction of Nd:YAG layer of 1.3 microns of wavelength (second embodiment). For comparison, the results of the device shown in FIG. 1(a) where the $SiO_2$ layer 7 is not present as the photosensitive element (first embodiment) are also shown. As can be appreciated from FIG. 4, in the photosensitive element having the $SiO_2$ layer 7 in the lower layer (second embodiment), the photo current is large and thus the photosensitive element of the second embodiment has higher sensitivity in comparison with the first embodiment. When 140 ps pulse of a Nd:YAG laser having 1.3 microns of wavelength is applied, the sensitivity in reception of the shown photosensitive element was −38 dBm. While the foregoing embodiment has been discussed in terms of employment of the avalanche photodiode in the photosensing portion, it has been confirmed that similar effects may be attained even when a PIN diode is employed.

Next, the characteristics of the photosensitive element shown in FIG. 1C will be discussed concretely. The construction of FIG. 1C can be obtained by employing the SIMOX or lamination type SOI substrate as the Si substrate and by providing sufficiently thicker thickness for the upper silicon layer in comparison with the thickness of the avalanche photodiode portion. In this instance, the SOI substrate was formed from a $SiO_2$ layer 7 having a thickness of 0.5 microns and an upper silicon layer having a thickness of 3.5 microns. On this substrate, the device 3 (driver) and the avalanche photodiode forming the photosensitive element 2 were formed through the process as set forth above. By employing this process, approximately 2 $\mu$m of Si layer 8 is formed between the avalanche photodiode and the $SiO_2$ layer. The Si layer 8 serves as a waveguide. Therefore, the light introduced into this range is sequentially introduced into the Si/$Si_{1-x}Ge_x$ photo absorbing layer and converted into electric signals. By providing the waveguide 8, problems associated with the cross-sectional area of the photo absorbing layer being much smaller than the cross-sectional area of the core portion of the optical fiber can be improved and thus conversion efficiency of the light can be improved.

FIG. 4 shows the relationship between the reverse bias voltage and the photo current of the shown avalanche photodiode upon introduction of Nd:YAG laser of 1.3 microns wavelength (third embodiment). The results when the $SiO_2$ layer 7 is not present as in the first embodiment and when $SiO_2$ layer is formed immediately below the avalanche photodiode is formed, are also shown. The third embodiment having the Si layer 8 between the avalanche photodiode and the $SiO_2$ layer 7, has the largest photo current. Therefore, the third embodiment of the photosensitive element has the highest sensitivity. The sensitivity in reception of the shown photosensitive element when 140 ps of pulse of the Nd:YAG laser having 1.3 microns wavelength was applied, was −40 dBm.

While the foregoing embodiment has been discussed in terms of employment of the avalanche photodiode in the photosensing portion, it has been confirmed that similar effects may be attained even when a PIN diode is employed.

While the shown embodiments have been discussed in terms of examples employing $Si_2H_6$ and germanium gas ($GeH_4$) for selective epitaxial growth for forming the photosensitive portion in the shown embodiment, it has been confirmed that the completely identical phenomenon will be arisen by silane gas ($SiH_4$), trisilane gas ($Si_3H_8$), and digermanium gas ($Ge_2H_6$). Also, while the selectivity of the $SiO_2$ has been discussed in the shown embodiments, the identical phenomenon has been observed in the case of $Si_3N_4$ and thus is effective for the present invention.

What is claimed is:

1. A silicon photosensitive element, comprising:
    a silicon substrate;
    a silicon device used as a driver formed on the surface of said silicon substrate;
    a groove formed on said surface of said silicon substrate by etching of Si; and
    a photosensing portion buried in said groove and forming no step with respect to the surface of said substrate and having a superlattice structure of Si and $Si_{1-x}Ge_x$, where x=0.6.

2. A silicon photosensitive element as set forth in claim 1, wherein said photosensing portion is an avalanche diode.

3. A silicon photosensitive element as set forth in claim 1, wherein said photosensing portion is a PIN diode.

4. A silicon photosensitive element as set forth in claim 1, which further comprises a photo reflection layer of $SiO_2$ located below said photosensing portion at the back side of said silicon substrate.

5. A silicon photosensitive element as set forth in claim 4, wherein a photo waveguide of silicon is formed between said photosensing portion and said photo reflection layer.

6. A photosensitive element, comprising:
    a silicon substrate;
    a groove formed in a surface of said silicon substrate; and
    a photo sensing portion formed in said groove, a surface of said photo sensing portion forming no step with respect to the surface of said silicon substrate, said photo sensing portion having a superlattice structure of Si and $Si_{1-x}Ge_x$, where x is 0.6.

7. A photosensitive element according to claim 6, further comprising a driver formed on said silicon substrate.

8. A photosensitive element according to claim 6, wherein said groove is etched in said silicon substrate.

9. A method of forming a photosensitive element, comprising:
    providing a silicon substrate;
    forming a driver on said silicon substrate;
    oxidizing a surface of said silicon substrate;
    etching said silicon substrate to form a groove thereon;
    oxidizing a surface of said silicon substrate and surfaces of said groove;
    implanting arsenic onto the bottom of the groove by ion implantation;
    forming a superlattice structure of Si and $Si_{1-x}Ge_x$ by selective epitaxial growth, so that no step is formed between said superlattice structure and said surface of said silicon substrate where x is 0.6; and etching a portion of the silicon substrate to form a groove for receiving an optical fiber to facilitate input of light to the superlattice structure.

10. A photosensitive element according to claim 6, wherein no step is formed between said photo sensing portion and said surface of said silicon substrate.

11. A photosensitive element according to claim 6, further comprising a driver formed on said silicon substrate, wherein said groove is etched in said silicon substrate.

12. The photosensitive element of claim 6, wherein said photo sensing portion completely fills said groove.

13. The photosensitive element of claim 6, wherein said silicon substrate has a first surface in which said groove is formed and a second surface opposite said first surface, and wherein an oxidized layer is formed on said second surface.

14. The photosensitive element of claim 13, wherein a waveguide is formed between said second surface and a bottom of said groove.

15. A method of forming a photosensitive element, comprising:

providing a silicon substrate having a first surface and a second surface;

forming a groove on said first surface of said silicon substrate;

forming a superlattice structure of Si and $Si_{1-x}Ge_x$ by selective epitaxial growth to substantially fill said groove, so that no step is formed between said superlattice structure and said first surface of said silicon substrate where x is 0.6.

16. The method of claim 15, wherein said groove is formed by etching said silicon substrate.

17. The method of claim 15, further comprising forming a driver on said silicon substrate prior to forming said superlattice structure.

18. The method of claim 15, further comprising providing an oxidized surface on said second surface of said silicon substrate, wherein said second surface is opposite said first surface.

19. The method of claim 15, further comprising oxidizing the first surface of said substrate and surfaces of said groove.

* * * * *